(12) United States Patent
Haase et al.

(10) Patent No.: US 8,311,017 B2
(45) Date of Patent: Nov. 13, 2012

(54) METHOD FOR INTERLEAVING BITS, A BASE STATION, A USER TERMINAL AND A COMMUNICATION NETWORK THEREFOR

(75) Inventors: Carsten Haase, Stuttgart (DE); Holger Hempel, Weil der Stadt (DE); Michael Ohm, Stuttgart (DE); Hans-Peter Mayer, Ditzingen (DE)

(73) Assignee: Alcatel Lucent, Paris (FR)

( * ) Notice: Subject to any disclaimer, the term of this patent is extended or adjusted under 35 U.S.C. 154(b) by 960 days.

(21) Appl. No.: 12/025,384

(22) Filed: Feb. 4, 2008

(65) Prior Publication Data

US 2008/0187055 A1 Aug. 7, 2008

(30) Foreign Application Priority Data

Feb. 5, 2007 (EP) .................................. 07300772

(51) Int. Cl.
*H04B 7/216* (2006.01)
(52) U.S. Cl. ........ 370/335; 370/315; 370/316; 370/319; 370/320; 370/464; 370/479
(58) Field of Classification Search .......... 370/310–350; 455/73–129; 375/240–376
See application file for complete search history.

(56) References Cited

U.S. PATENT DOCUMENTS

| 6,337,642 | B1* | 1/2002 | Yagil ............................... 341/50 |
| 6,848,036 | B1* | 1/2005 | Dave et al. ..................... 711/157 |
| 2002/0159423 | A1* | 10/2002 | Yao et al. ...................... 370/342 |

FOREIGN PATENT DOCUMENTS

EP 1 113 581 A2 7/2001

OTHER PUBLICATIONS

Ericsson, Qualcomm, Motorola, Philips, "Draft Introduction of 16QAM for HSUPA", TDOC R1-070590 of TSG RAN WG 1 Meeting #47BIS, Online—Jan. 15-19, 2007, XP002461047.

* cited by examiner

*Primary Examiner* — Charles C Jiang
(74) *Attorney, Agent, or Firm* — Fay Sharpe LLP

(57) ABSTRACT

The invention concerns a method for interleaving a dedicated set of bits that is divided in an appropriate number of blocks using for each block an interleaver matrix with a predefined first dimension for interleaving the bits within each block, whereby said appropriate number of blocks is estimated in such a way that a value of a second dimension of the interleaver matrix that is needed to interleave the bits within each block lies within a dedicated range, a base station (BS1-BS8), a user terminal (T1-T4) and a communication network (CN) therefor.

8 Claims, 3 Drawing Sheets

US 8,311,017 B2

METHOD FOR INTERLEAVING BITS, A BASE STATION, A USER TERMINAL AND A COMMUNICATION NETWORK THEREFOR

BACKGROUND OF THE INVENTION

The invention is based on a priority application EP07300772.6 which is hereby incorporated by reference.

The invention relates to a method for interleaving bits according to the preamble of claim 1, a base station according to the preamble of claim 6, a user terminal according to the preamble of claim 7 and a communication network according to the preamble of claim 8.

The transmission of data over communication channels, especially over radio channels in a mobile communication system or in a wireless data system, is often error-prone, as such effects like interference, fading, shadowing or noise deteriorate the transmission signal and thus lead to bit errors.

As such bit errors tend to have a cumulative occurrence e.g. over transmission time or bandwidth, bits that have to be transmitted over a communication channel are preferably interleaved in a so-called interleaver in order to achieve a statistical distribution of bit errors.

After the channel encoding at the transmitter by e.g. a Turbo encoder, an interleaver is used to rearrange the bits within the transmitted codewords. On the receiver side, a deinterleaver performs the inverse rearrangement on the received codewords before the actual channel decoding. This procedure transforms channel induced burst errors into statistically independent errors and is vital in mobile radio communication systems with fading channels.

In common interleaver implementations, a codeword that has to be transmitted over a communication channel is first segmented into $k \geq 1$ blocks. Each of the blocks is interleaved separately in an interleaver, i.e. the number of blocks corresponds to the number of interleaving cycles that have to be performed. An interleaver basically comprises a matrix into which the information bits are written column-wise and then read out row-wise. The number of columns N of the individual interleavers is fixed. Between writing and reading, the columns may be permuted according to a given permutation rule. The number of blocks k and the number of matrix rows $R_i$, i=1 . . . k, must be adjusted to the codeword size. The number of blocks k is fixed or takes on one of only a few predefined values. In the latter case it is usually found by table look-up. For performance reasons it is desirable to have individual interleavers with $N \approx R_i$, i.e. the number of rows should be approximately equal to the number of columns. With these individual interleaver dimensions, burst errors within a codeword introduced by e.g. a fading channel are transformed into statistically independent errors in the best possible way. This is very important because forward error correction channel encoding, e.g. Turbo encoding, usually requires statistically distributed errors to leverage its full potentials.

As the deinterleaver performs the inverse operation, it follows directly from the interleaver.

In the 3GPP Evolved UTRAN (3GPP=Third Generation Partnership Project, UTRAN=Universal Mobile Telecommunication System Radio Access Network), also known as Long Term Evolution (LTE), the number of data symbols within the codewords transmitted from a so-called NodeB, i.e. a base station, to the so-called user equipment (UE), i.e. a user terminal, may change with a granularity of 1 symbol from codeword to codeword, depending on cell traffic, signaling overhead, radio conditions, etc. As each data symbol represents a number M of information bits, the granularity of the information bits within a codeword is M, e.g. M=2 for QPSK modulation (QPSK=Quadrature Phase Shift Keying).

An interleaver that is appropriate for usage within 3GPP Evolved UTRAN must offer a high flexibility towards the codeword size.

One solution for a 3GPP Evolved UTRAN compliant interleaver could be the UMTS (UMTS=Universal Mobile Telecommunication System) HSDPA (HSDPA=High Speed Downlink Packet Access) interleaver defined in the technical specification 3GPP TS 25.212, V7.2.0 (2006 June) in chapter 4.5.6 with the restriction to only few codeword sizes, as the interleavers work with a fixed number of columns N=30, a fixed number of rows $R_i$=R=32 and a number of blocks $k \in \{1, \ldots, 15\}$.

For a high codeword size flexibility and a fine codeword size granularity, as used in the 3GPP Evolved UTRAN, a restricted interleaver parameter set, as e.g. used for the UMTS HSDPA interleaver described above, will lead with a high probability to individual interleavers that are not close to the desirable square form ($N \approx R_i$), but exhibit a rather large difference between the number of columns N and rows $R_i$.

SUMMARY OF THE INVENTION

The object of the invention is thus to propose a method for interleaving bits that is appropriate for a scenario with a high codeword size flexibility and a fine codeword size granularity by means of using individual interleavers that are close to the square form ($N \approx R_i$).

This object is achieved by a method according to the teaching of claim 1, a base station according to the teaching of claim 6, a user terminal according to the teaching of claim 7, and a communication network according to the teaching of claim 8.

The main idea of the invention is that the invented interleaver calculates for each codeword size the number of required blocks k, such that all individual interleavers have approximately the desirable square form, i.e. the number of rows $R_i$=R is approximately equal to the predefined number of columns N. In other words, the number of required blocks k is calculated in such a way, that the number of rows $R_i$=R lies within a dedicated range.

Further developments of the invention can be gathered from the dependent claims and the following description.

BRIEF DESCRIPTION OF THE DRAWINGS

In the following, the invention will be explained further making reference to the attached drawings.

A communication network in which the invention can be implemented comprises at least one base station and user terminals.

Figure 1:
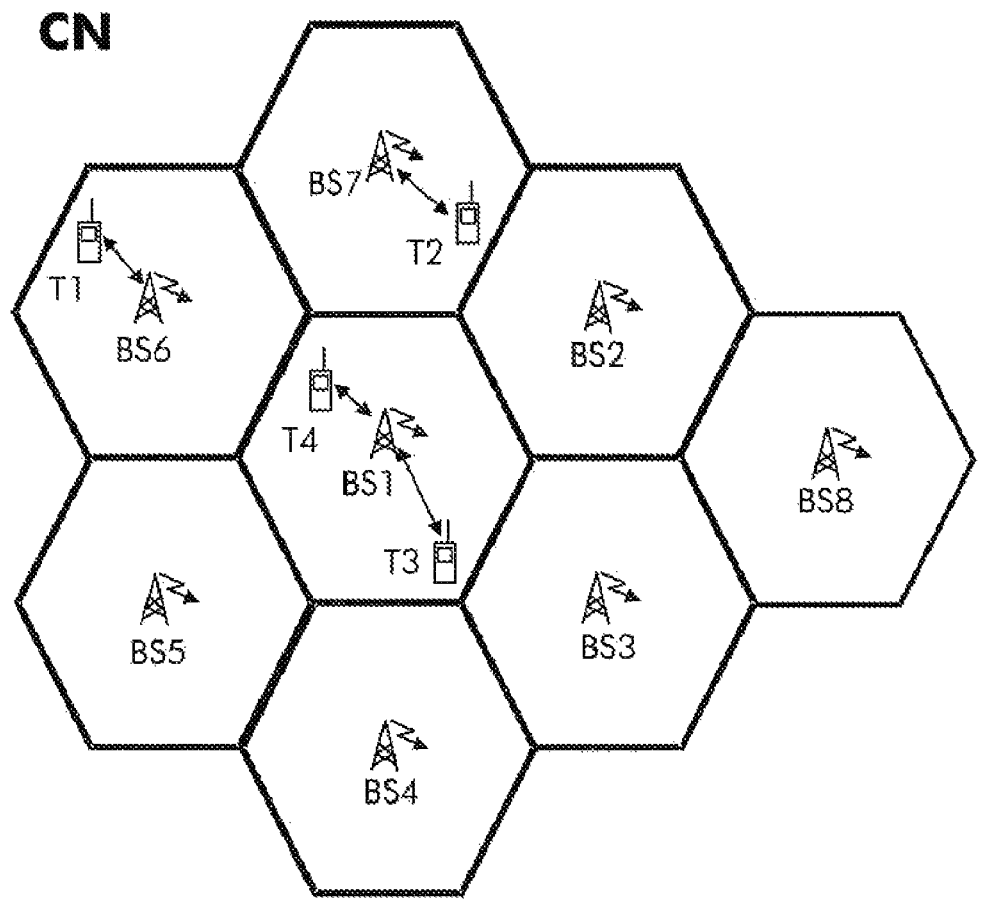
FIG. 1 schematically shows a communication network in which the invention can be implemented.

FIG. 1 shows as an example for such a communication network a cellular mobile communication network CN that comprises base stations BS1-BS8 and user terminals T1-T4. Each of said user terminals T1-T4 is connected to one or multiple of said base stations BS1-BS8, which is symbolized by double arrows in FIG. 1. The base stations BS1-BS8 are in turn connected to a core network, which is not shown in FIG. 1 for the sake of simplicity.

The user terminals T1-T4 comprise the functionality of a user terminal for transmission and reception of signaling and data messages in a network using radio transmission.

The base stations BS1-BS8 comprise the functionality of a base station of a network using radio transmission, i.e. they provide the possibility for user terminals to get connected to said network and for data exchange of said user terminals by means of radio transmission.

Figure 2:
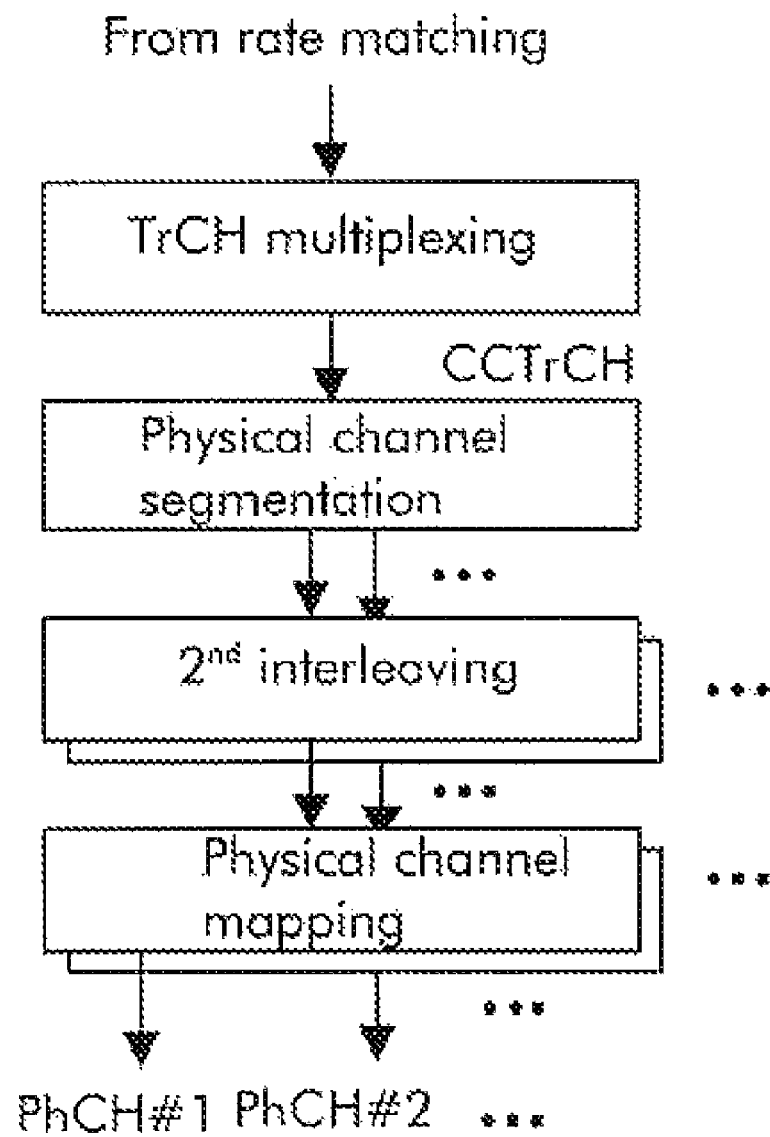
FIG. 2 schematically shows exemplarily a transport channel multiplexing and interleaving procedure for uplink that can make use of a method for interleaving according to the invention.

FIG. 2 shows a part of a transport channel multiplexing and interleaving procedure for uplink that can make use of a method for interleaving according to the invention and that can be implemented in a transmitter comprised e.g. in a user terminal T1-T4.

After channel coding and rate matching, transport channels TrCH are multiplexed into a coded composite transport channel CCTrCH.

Then, physical channel segmentation divides the bits among the different physical channels PhCH#1, PhCH#2.

Afterwards, a $2^{nd}$ interleaving is performed for the different physical channels PhCH#1, PhCH#2 by block interleavers and comprises bits input to a interleaver matrix with padding, the inter-column permutation for the interleaver matrix and bits output from the interleaver matrix with pruning. An interleaver according to the invention can e.g. be used for the $2^{nd}$ interleaving.

Finally, during physical channel mapping, the bits are mapped to the different physical channels PhCH#1, PhCH#2 and transmitted over the air.

Such an exemplary transport channel multiplexing and interleaving procedure for uplink is described in more detail in the technical specification 3GPP TS 25.212, V7.2.0 (2006 June) in chapter 4.2 and the related chapters. Here, in an analogue way a channel multiplexing and interleaving procedure for downlink is described that can also make use of a method for interleaving according to the invention and that can be implemented in a transmitter comprised e.g. in a base station BS1-BS8.

The invented interleaver calculates for each codeword size the number of required blocks k, such that all individual interleaver matrices have approximately the desirable square form, i.e. the number of rows $R_i=R$ is approximately equal to the predefined number of columns N.

In the following, exemplarily two different strategies are described for achieving approximately the desirable square form for the interleaver matrices:

According to the first strategy, the number of blocks k is estimated based on the choice that the lowest value for the number of rows $R_{min}$ that is allowed to occur for the number of bits being higher than a certain limit is equal to the predefined number of columns N, i.e. $R_{min}=N$. With this strategy, the average number of rows is $R_{avg}=(3/2)N$, and the maximum number of rows is $R_{max}=2N$ for the number of bits being higher than a certain limit.

According to the second strategy, the number of blocks k is estimated based on the choice that the lowest value for the number of rows $R_{min}$ that is allowed to occur for the number of bits being higher than a certain limit is equal to two third of the fixed number of columns N, i.e. $R_{min}=(2/3)N$. With this second strategy, the average number of rows is $R_{avg}=N$, and the maximum number of rows is $R_{max}=(4/3)N$ for the number of bits being higher than a certain limit.

In other words, according to the first strategy, interleaver matrices with the lowest possible number of rows have the desirable square form, whereas according to the second strategy, interleaver matrices with the average number of rows have the desirable square form.

The first strategy will be described first with its necessary calculations. Afterwards, the changes to the first strategy in order to arrive at the second strategy will be presented.

First Strategy:

An input of L bits from a channel encoder or a rate matching module is split into m bit streams each with a number of b bits, as e.g. described in the technical specification 3GPP TS 25.212, V7.2.0 (2006 June). Preferably, each of said m bit streams is processed in a separate interleaver, with the number of columns and rows of the respective interleaver matrices preferably being identical. The input is divided two by two between the m interleavers, i.e. the $1^{st}$ and the $2^{nd}$ bit go to the first interleaver, the $3^{rd}$ and the $4^{th}$ to the second interleaver, et cetera, so that the $(2*m-1)^{th}$ bit and the $(2*m)^{th}$ bit go to the $m^{th}$ interleaver.

Thus, the number of bits b in each of said m bit streams can be calculated according to the following formula:

$$b=L/m$$

According to the technical specification 3GPP TS 25.212, V7.2.0 (2006 June), the value for the m bit streams depends on the modulation scheme. For example, for QPSK modulation (QPSK=Quadrature Phase Shift Keying), the value for m=1, for 16-QAM modulation (QAM=Quadrature Phase Shift Keying), the value for m=2, and for 64-QAM modulation, the value for m=3.

The procedure is described in 3GPP TS 25.212 V7.2.0 (2006 June) in more detail for 16-QAM modulation. For 64-QAM modulation or higher order modulation schemes, it follows analogously. Note that the step of dividing the bit streams is 3GPP specific and is not necessarily required for the invented interleaver.

In the following only one out of the m interleavers is considered, as the calculated values are valid for all m streams and interleavers, respectively.

The highest interleaving performance is reached with N×N interleaver matrices, when N is the predefined number of columns. In order to approximate this square form by R×N interleaver matrices with R≈N, k interleaving cycles, i.e. blocks, with k being an integer number, are needed to process the b bits:

$$n=\text{integer}(b/(N*N))$$

if n=0: k=1 else k=n

In this calculation for the number of blocks k, it is taken into account that there must be at least one interleaving cycle.

Due to the fact that the number of bits b is normally no multiple of N×N, there are some bits left. The number of these remaining l bits per bit stream with a number of bits b after k interleaving cycles with an N×N interleaver matrix results from the following formula:

$$l=b \bmod(N*N*k)$$

To process l additional bits in the k interleaving cycles, a variation of the number of rows R is needed taking into account that the number of rows R should be near the number of columns N according to the following formula:

if n=0: $R=\text{ceil}(l/(k*N))$ else: $R=\text{ceil}(l/(k*N)+N$

In the majority of cases the number of bits b is not a multiple of N×R. So the interleaver matrix must be padded with fill bits. The number of fill bits $f_{ges}$ in k interleaving cycles is determined according to the following formula:

$$f_{ges}=R*N*k*m-b*m$$

Accordingly, the number of fill bits per bit stream in k interleaving cycles $f_{ges,s}$ is determined according to the following formula:

$$f_{ges,s}=R*N*k-b$$

The interleaving bits are split on the several interleaving cycles. They are only used as a placeholder and are not transmitted. They have to be skipped when reading out the interleaver matrix.

The minimum number of fill bits per bit stream and per interleaving cycle $f_{min}$ is consequently determined according to the following formula:

$$f_{min}=\text{floor}(f_{ges}/(m*k*2))*2$$

Alternatively, the minimum number of fill bits per bit stream and per interleaving cycle $f_{min}$ is determined according to the following formula based on $f_{ges,s}$:

$$f_{min}=\text{floor}(f_{ges,s}/(k*2))*2$$

To fulfill the input width of 2 bits per bit stream in the symbol processing chain, there must be p interleaving cycles with fmin+2 fill bits determined according to the following formula:

$$p=(f_{ges}-f_{min}*m*k)/(m*2)$$

Alternatively, the p interleaving cycles with fmin+2 fill bits are determined according to the following formula based on $f_{ges,s}$:

$$p=(f_{ges,s}-f_{min}*k)/2$$

For the other q=k-p interleaving cycles, $f_{min}$ fill bits are needed to pad the interleaver matrix.

Because of the two by two distribution of the input bits, the algorithm described above only works with N mod 2=0. If the input is divided one by one to the interleaver matrices, all column widths are allowed, but the equations for the minimum number of fill bits per bit stream and per interleaving cycle $f_{min}$ and for the p interleaving cycles with fmin+2 fill bits have to be modified according to the following formulae:

$$f_{min}=\text{floor}(f_{ges}/(m*k)) \text{ or } f_{min}=\text{floor}(f_{ges,s}/k)$$

$$p=(f_{ges}-f_{min}*m*k)/m \text{ or } p=f_{ges,s}-f_{min}*k$$

Second Strategy:

The second strategy comprises the steps of the first strategy with the following modifications:

The k interleaving cycles, i.e. blocks, are calculated according to the following formula:

$$n=\text{integer}(b/(N*\text{round}(\tfrac{2}{3}*N)))$$

if n=0: k=1 else k=n

The number of the remaining l bits per bit stream with a number of bits b after k interleaving cycles with an N×(⅔)N interleaver matrix results from the following formula:

$$l=b \bmod N*(\tfrac{2}{3})N*k$$

To process the l additional bits in the k interleaving cycles, a variation of the number of rows R is needed taking into account that the number of rows R should be near the number of columns N according to the following formula:

if $n=0$: $R=\text{ceil}(l/(k*N))$ else: $R=\text{ceil}(l/(k*N)+\text{round}(\tfrac{2}{3}*N))$ In a preferred embodiment of the invention, the number of columns N are set to a fixed value for all interleaver runs.

In another embodiment of the invention, the interleaver matrix size is roughly matched to the codeword size by defining an appropriate number of columns which should neither exceed an upper bound $N_{MAX}$, nor fall below a lower bound $N_{MIN}$ of the related processing platform. The actual number of columns N can be calculated before each interleaver run e.g. by the following algorithm expressed in the programming language C:

```
N=N_MIN;
for (j=N_MAX; j > N_MIN; j-=2) {        // j-- in case of mx1
    g = b/(j * j);
    if (g>=1) then {
        N=j;
        Break;
    }
}
```

Figure 3:
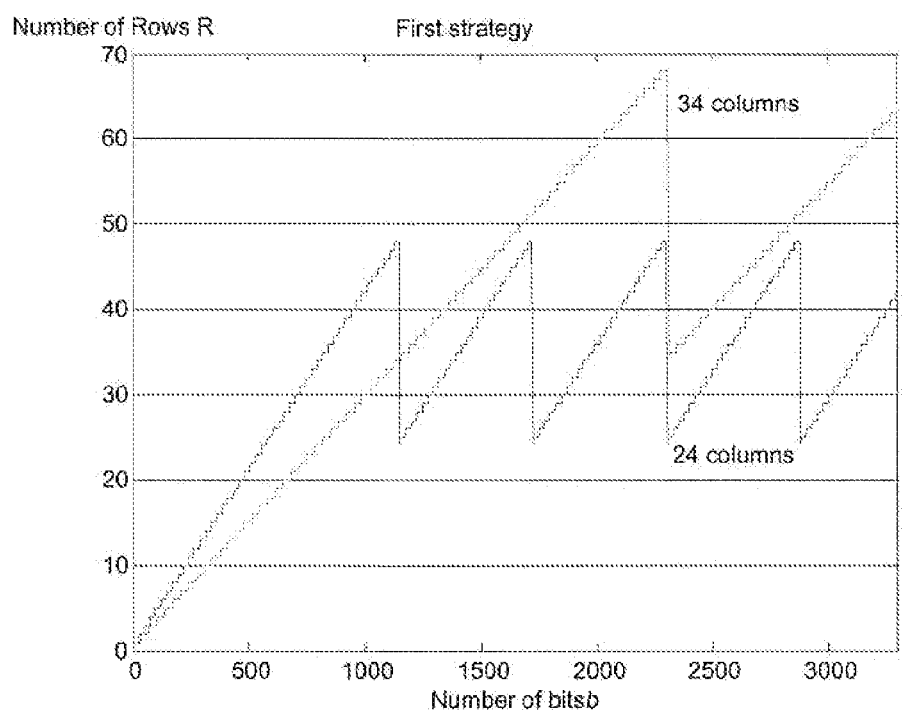
FIG. 3 schematically shows the number of rows of an interleaver depicted over the number of bits calculated for two strategies of the method for interleaving according to the invention.
Figure 3:
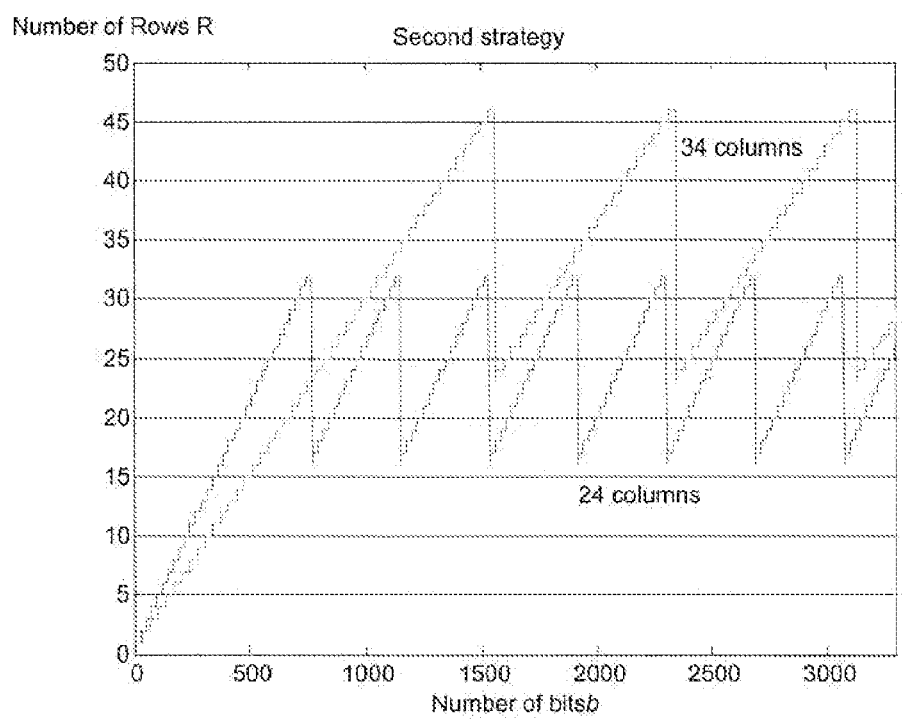

In FIG. 3, the calculated number of rows R is plotted against the number of bits b per stream for illustration of the first and the second strategy.

In the upper diagram, the number of rows R is calculated according to the first strategy for 24 and 34 columns. It can be seen, that for higher number of bits b, the lowest number of rows that can occur is 24 and 34 respectively, and that there is an upper limit for the number of rows R.

In the lower diagram, the number of rows R is calculated according to the second strategy for 24 and 34 columns. It can be seen, that for higher number of bits b, number of rows is oscillating around a value of 24 and 34 respectively.

The invented interleaver has been described above for the case of a predefined number of columns and a number of rows that is calculated according to a certain procedure. Of course, the invented interleaver can also be described for the case of exchanged roles of columns and rows, so that in a more general description, an interleaver matrix according to the invention has a first predefined dimension and a second calculated dimension.

The invention claimed is:

1. A method for interleaving, in a packet network, a dedicated set of bits that is divided into a number of blocks of data, said method comprising:

using for each block of data an interleaver matrix with a predefined first dimension for interleaving the bits within each block of data;

wherein said number of blocks of data is chosen so that a value of a second dimension of the interleaver matrix that is needed to interleave the bits within each block of data lies within a dedicated range, and said number of blocks of data is estimated, by at least one element of the packet network, based on a defined lowest value of the second dimension of the interleaver matrix that is allowed to occur, for the number of bits of the dedicated set of bits being higher than the value of the first dimension multiplied with the lowest value of the second dimension;

wherein a highest possible number of blocks of data, for which a given interleaver matrix has no vacant array element when interleaving the bits within each block of data, is estimated using the given interleaver matrix with said predefined first dimension and said defined lowest value as a value for the second dimension;

wherein if said highest possible number of blocks of data is at least one, said appropriate number of blocks of data is equal to said highest possible number of blocks of data ; and if said highest possible number of blocks of data is zero, said number of blocks of data is one.

2. The method according to claim 1, wherein a lowest limit for the second dimension of the interleaver matrix is estimated that allows for an interleaving of the dedicated set of bits in said number of blocks of data.

3. The method according to claim 2, wherein the dedicated set of bits is divided into the number of blocks of data in such a way, that the difference between the number bits in each block of data is as low as possible.

4. The method according to claim 1, wherein the predefined first dimension of said interleaver matrix is calculated or chosen based on the number of bits of the dedicated set of bits.

5. A base station for interleaving a dedicated set of bits that is divided in a number of blocks of data using for each block of data an interleaver matrix with a predefined first dimension for interleaving the bits within each block of data, wherein said base station comprises at least processor and a memory including instructions which when executed by the processor are operative to to:
  perform a choice of said number of blocks of data in such a way that a value of a second dimension of the interleaver matrix that is needed to interleave the bits within each block of data lies within a dedicated range,
  estimate said number of blocks of data based on a defined lowest value of the second dimension of the interleaver matrix that is allowed to occur, for the number of bits of the dedicated set of bits being higher than the value of the first dimension multiplied with the lowest value of the second dimension,
  estimate the highest possible number of blocks of data for which a given interleaver matrix has no vacant array element when interleaving the bits within each block of data, said given interleaver matrix having said predefined first dimension and said defined lowest value as a value for the second dimension,
  with said number of blocks of data being equal to said highest possible number of blocks of data if said highest possible number of blocks of data is at least one, and,
  with said number of blocks of data being one if said highest possible number of blocks of data is zero.

6. A base station according to claim 5, wherein the base station is implemented in a communication network comprising base stations and user terminals.

7. A user terminal for interleaving a dedicated set of bits that is divided in a number of blocks of data using for each block of data an interleaver matrix with a predefined first dimension for interleaving the bits within each block of data, wherein said user terminal comprises at least one processor and a memory including instructions which when executed by the processor are operative to to:
  perform a choice of said number of blocks of data in such a way that a value of a second dimension of the interleaver matrix that is needed to interleave the bits within each block lies within a dedicated range,
  estimate said number of blocks of data based on a defined lowest value of the second dimension of the interleaver matrix that is allowed to occur, for the number of bits of the dedicated set of bits being higher than the value of the first dimension multiplied with the lowest value of the second dimension,
  estimate the highest possible number of blocks of data for which a given interleaver matrix has no vacant array element when interleaving the bits within each block of data, said given interleaver matrix having said predefined first dimension and said defined lowest value as a value for the second dimension,
  with said number of blocks of data being equal to said highest possible number of blocks of data if said highest possible number of blocks of data is at least one, and,
  with said number of blocks of data being one if said highest possible number of blocks of data is zero.

8. A user terminal according to claim 7, wherein the user terminal is implemented in a communication network comprising base stations and user terminals.

* * * * *